United States Patent [19]
Yiu et al.

[11] Patent Number: 5,399,891
[45] Date of Patent: Mar. 21, 1995

[54] FLOATING GATE OR FLASH EPROM TRANSISTOR ARRAY HAVING CONTACTLESS SOURCE AND DRAIN DIFFUSIONS

[75] Inventors: Tom D. H. Yiu, Milpitas, Calif.; Fuchia Shone, Hsinchu, Taiwan, Prov. of China; Tien-Ler Lin, Cupertino; Ling Chen, Sunnyvale, both of Calif.

[73] Assignee: Macronix International Co., Ltd., Hsinchu, Taiwan, Prov. of China

[21] Appl. No.: 187,118
[22] Filed: Jan. 25, 1994

Related U.S. Application Data
[63] Continuation of Ser. No. 823,882, Jan. 22, 1992, abandoned.

[51] Int. Cl.⁶ .................. H01L 29/68; H01L 29/78
[52] U.S. Cl. .................. 257/316; 257/314; 257/315; 257/319; 257/321; 365/185; 365/218; 365/900
[58] Field of Search ............ 257/314, 315, 316, 317, 257/319, 321; 365/900, 185, 218

[56] References Cited

U.S. PATENT DOCUMENTS

| | | | |
|---|---|---|---|
| 4,258,378 | 3/1981 | Wall | 257/315 |
| 4,451,904 | 5/1984 | Sugiura et al. | 257/316 |
| 4,639,893 | 1/1987 | Eitan | 365/185 |
| 4,698,787 | 10/1987 | Mukherjee et al. | 365/185 |
| 4,780,424 | 10/1988 | Holler et al. | 437/29 |
| 4,792,925 | 12/1988 | Corda et al. | |
| 4,812,885 | 3/1989 | Riemenschneider | |
| 5,012,446 | 4/1991 | Bergemont | 365/185 |
| 5,023,681 | 6/1991 | Ha | |
| 5,023,837 | 6/1991 | Schreck et al. | |
| 5,028,979 | 7/1991 | Mazzali | 257/316 |
| 5,045,489 | 9/1991 | Gill et al. | 257/316 |
| 5,060,195 | 10/1991 | Gill et al. | 257/316 |
| 5,117,269 | 5/1992 | Bellizza et al. | 365/185 |
| 5,168,335 | 12/1992 | D'Arrigo et al. | 257/319 |
| 5,245,570 | 9/1993 | Fazio et al. | |

FOREIGN PATENT DOCUMENTS

| | | |
|---|---|---|
| 0354858A1 | 8/1988 | European Pat. Off. |
| 0298430 | 1/1989 | European Pat. Off. ............ 257/321 |
| 0386631A2 | 3/1989 | European Pat. Off. |
| 0422347A2 | 9/1989 | European Pat. Off. |
| 0461764A2 | 6/1990 | European Pat. Off. |
| 0461764A3 | 6/1990 | European Pat. Off. |
| 2241380 | 2/1990 | United Kingdom |

OTHER PUBLICATIONS

Kazerounian, et al.; "Alternate Metal Virtual Ground EPROM Array Implemented in a 0.8 μM Process for Very High Density Applications"; IEDM, published by IEEE, 1991; pp. 11.5.1 to 11.5.4.

Kodama, et al.; "A Symmetrical Side Wall (SSW)-DSA Cell for a 64 Bit Flash Memory"; IEDM, published by IEEE, 1991; pp. 11-3-1, to 11-3-4.

McConnell, et al.; "An Experimental 4-Mb Flash EPROM with Sector Erase"; IEEE Journal of Solid-State Circuits; vol. 26, No. 4, Apr., 1991; pp. 484-489.

Woo, et al.; "A Novel Memory Cell Using Flash Array Contactless EPROM (Face) Technology"; IEDM, published by IEEE, 1990; pp. 5.1.1-5.1.4.

Woo, et al.; "A Poly-Buffered Face Technology for High Density Flash Memories"; 1991, Symposium on VLSI Technology; pp. 73-74.

Primary Examiner—Ngân V. Ngô
Attorney, Agent, or Firm—Haynes & Davis

[57] ABSTRACT

Novel contactless FLASH EPROM cell and array designs, and methods for fabricating the same is based on a unique drain-source-drain configuration, in which a single source diffusion is shared by two columns of transistors. An elongated first drain diffusion region, an elongated source diffusion region, and an elongated second drain diffusion region, are formed in a semi-conductor substrate along essentially parallel lines. Field oxide regions are grown on opposite sides of the first and second drain diffusion regions. Floating gates and control gate wordlines are formed orthogonal to the drain-source-drain structure to establish two columns of storage cells having a shared source region. The shared source region is coupled through a bottom block select transistor to a virtual ground terminal. Each drain diffusion region is coupled through a top block select transistor to global bitline. The cell structure uses two metal global bitlines which extend essentially parallel to the drain, source and drain diffusion regions, and a virtual ground conductor which couples a plurality of columns of transistors to a virtual ground terminal through a horizontal conductor, such as a buried diffusion line.

54 Claims, 8 Drawing Sheets

FIG.—1

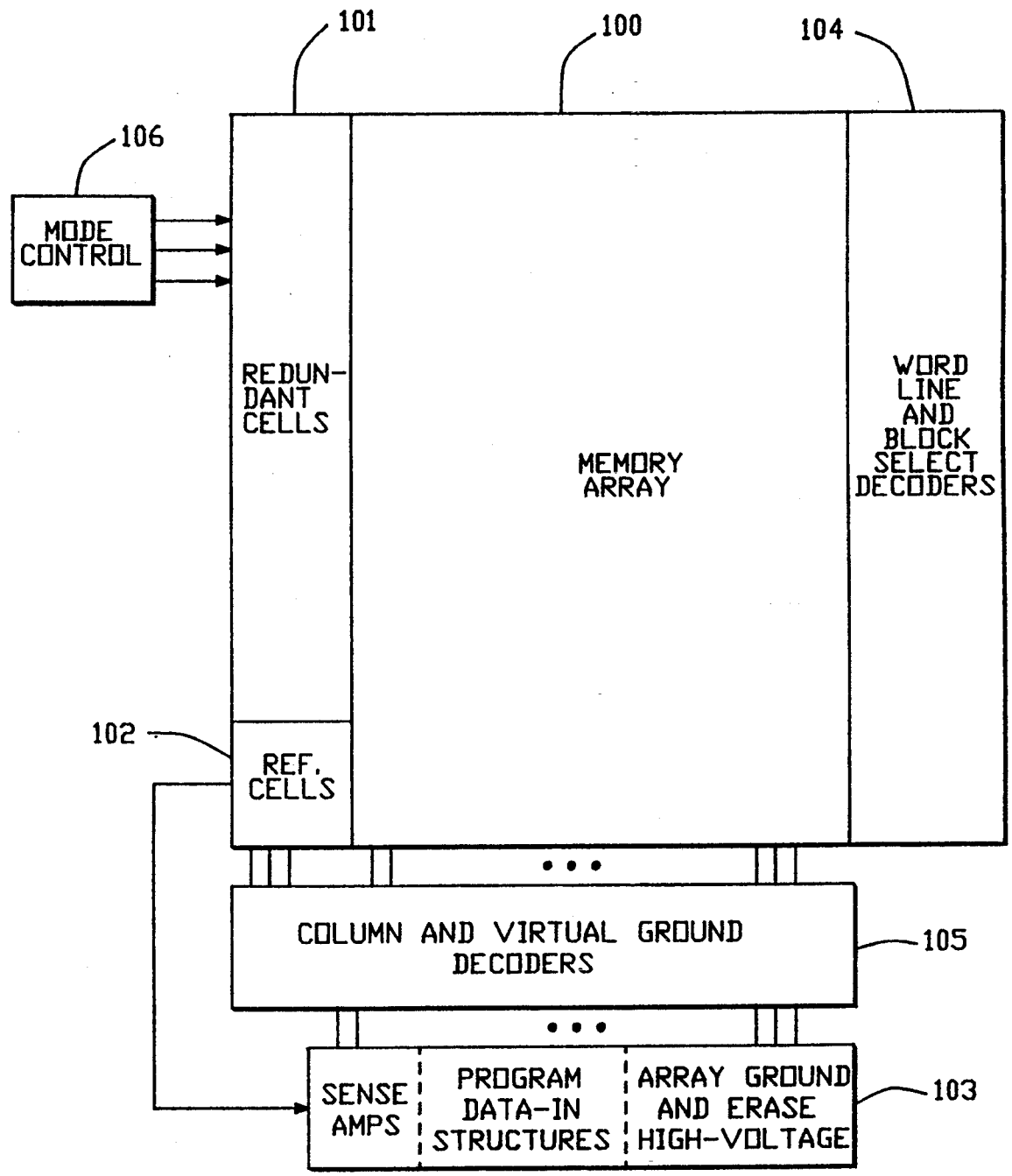
FIG.—3

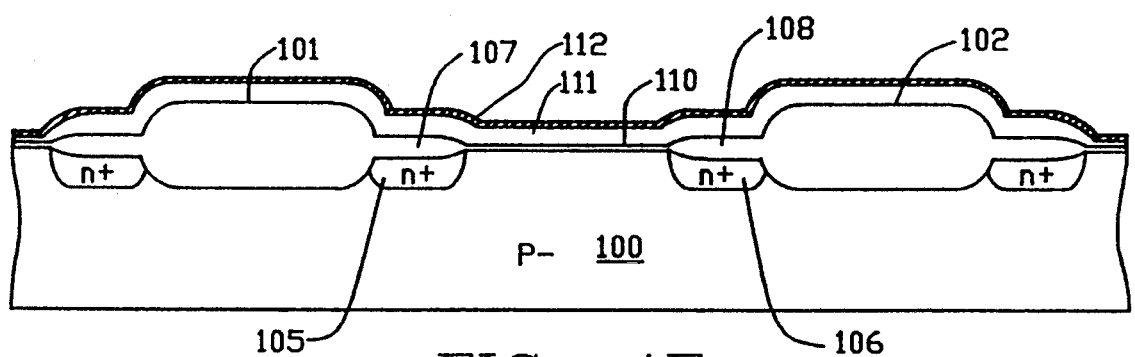
FIG.—4E
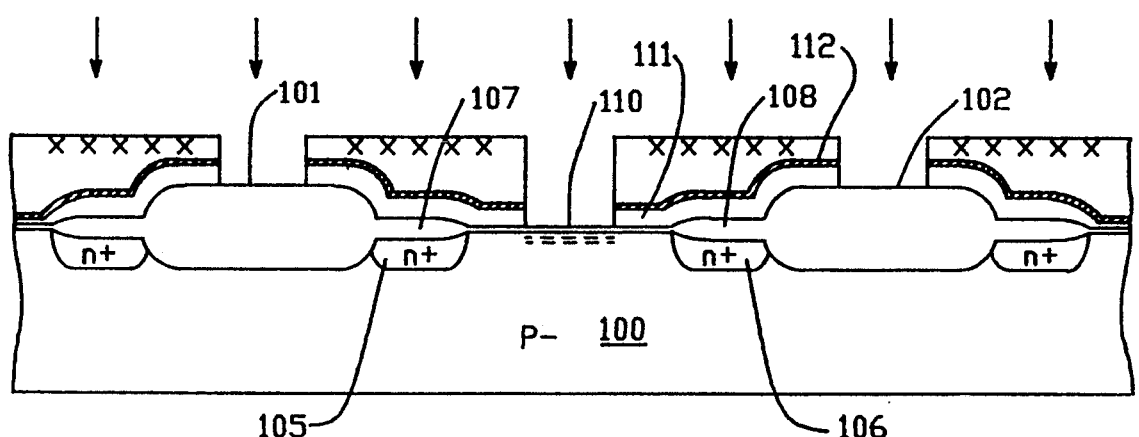
FIG.—4F
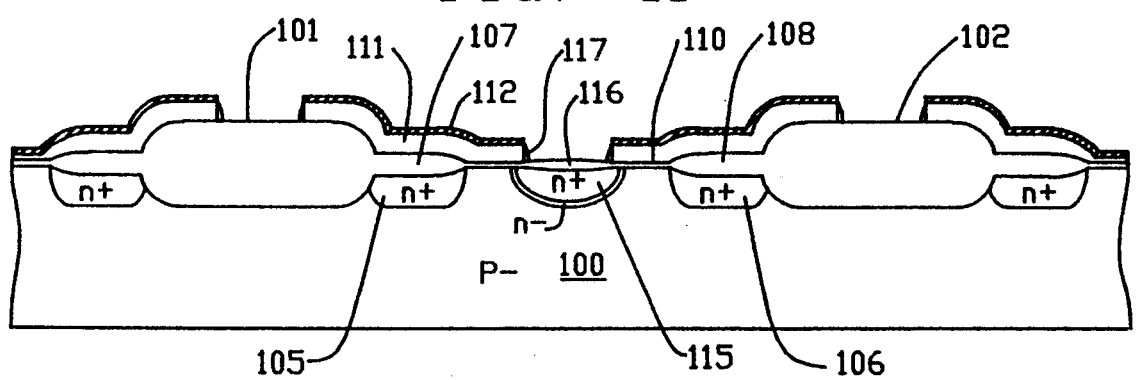
FIG.—4G
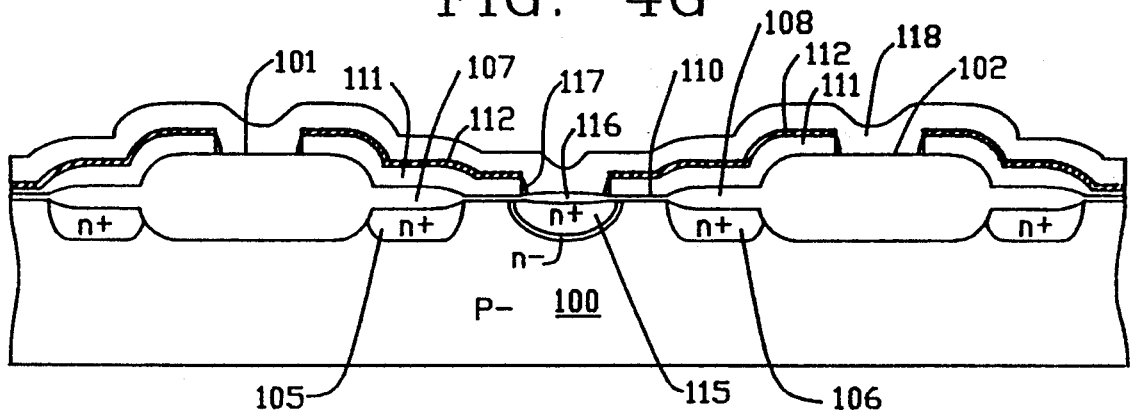
FIG.—4H

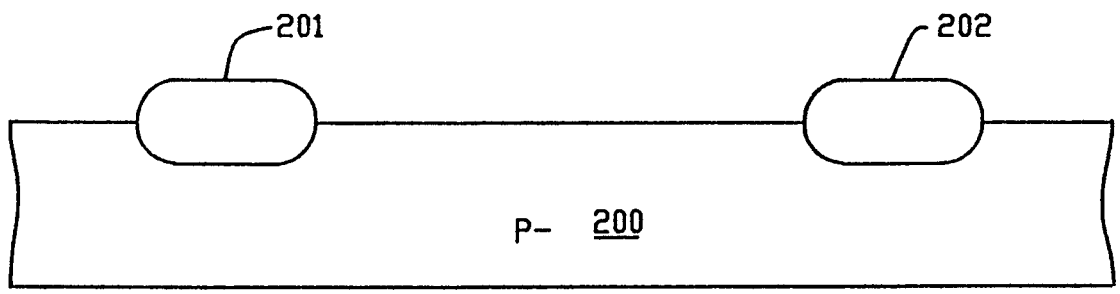
FIG.−5A
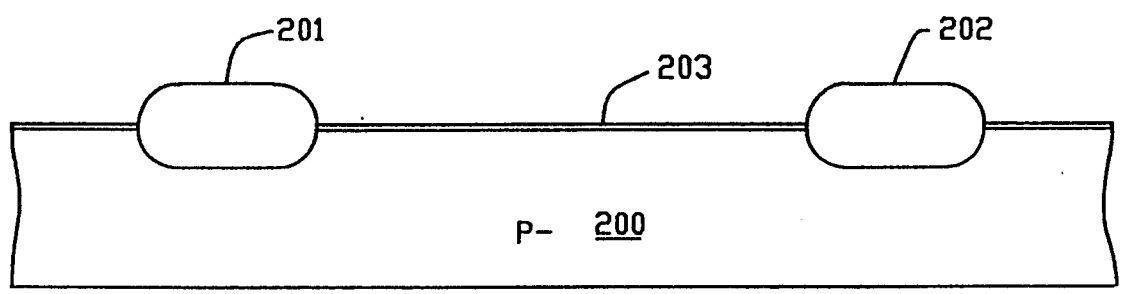
FIG.−5B
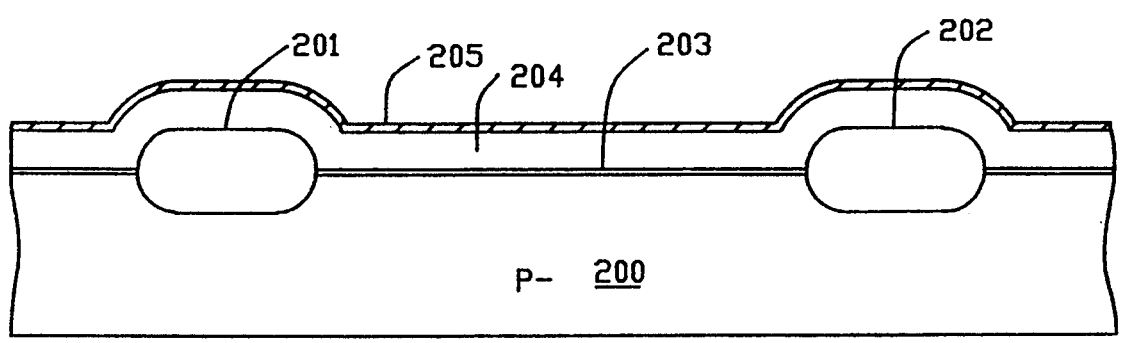
FIG.−5C
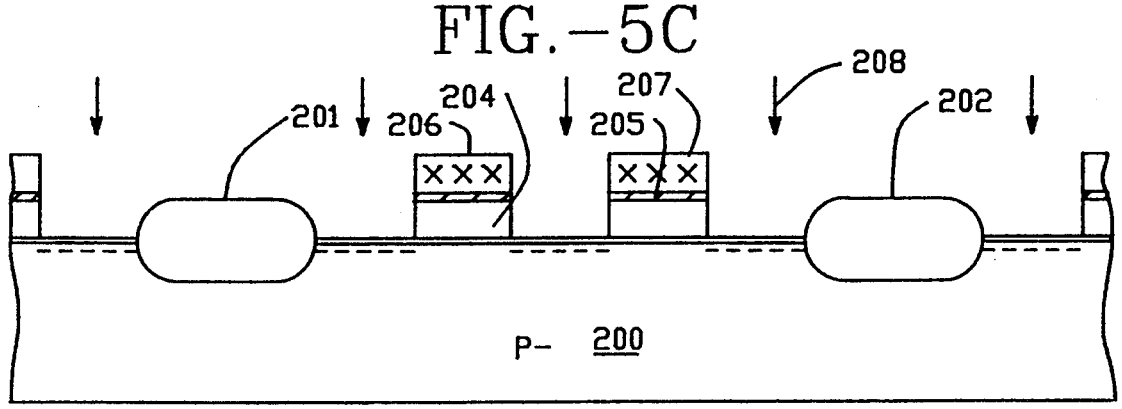
FIG.−5D

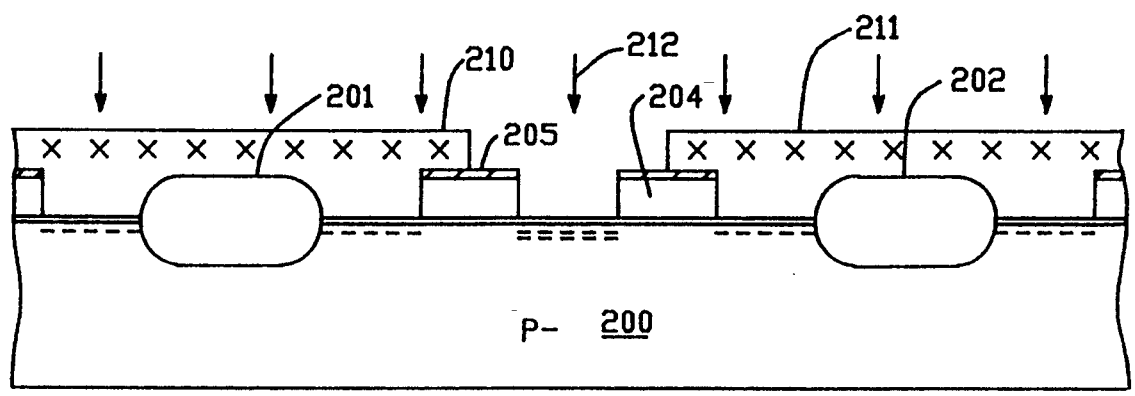
FIG.—5E
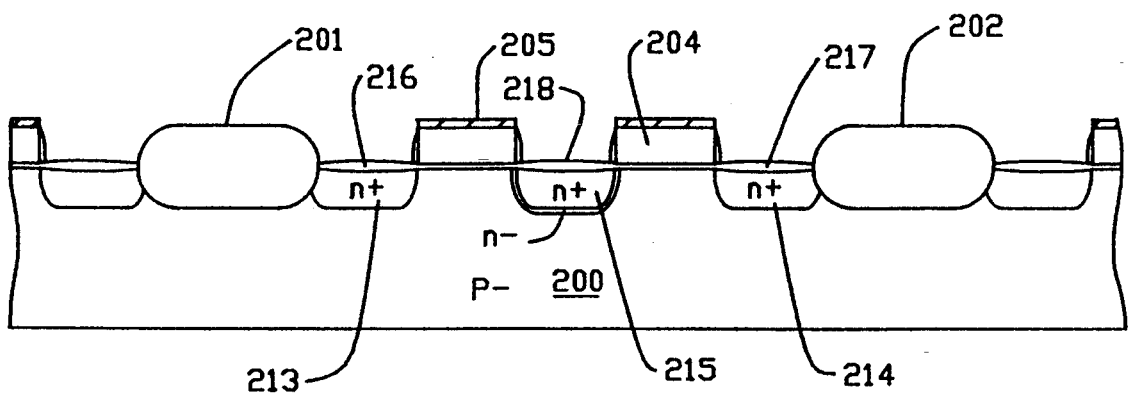
FIG.—5F
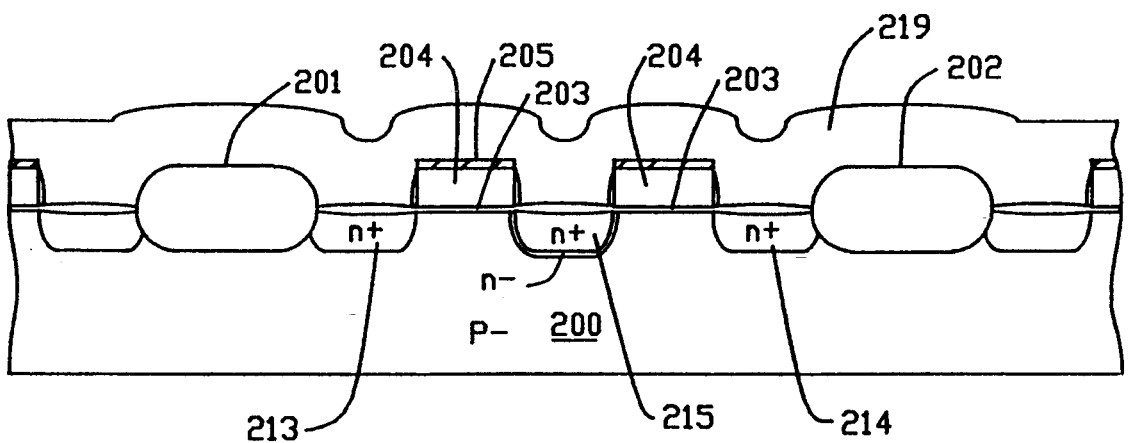
FIG.—5G

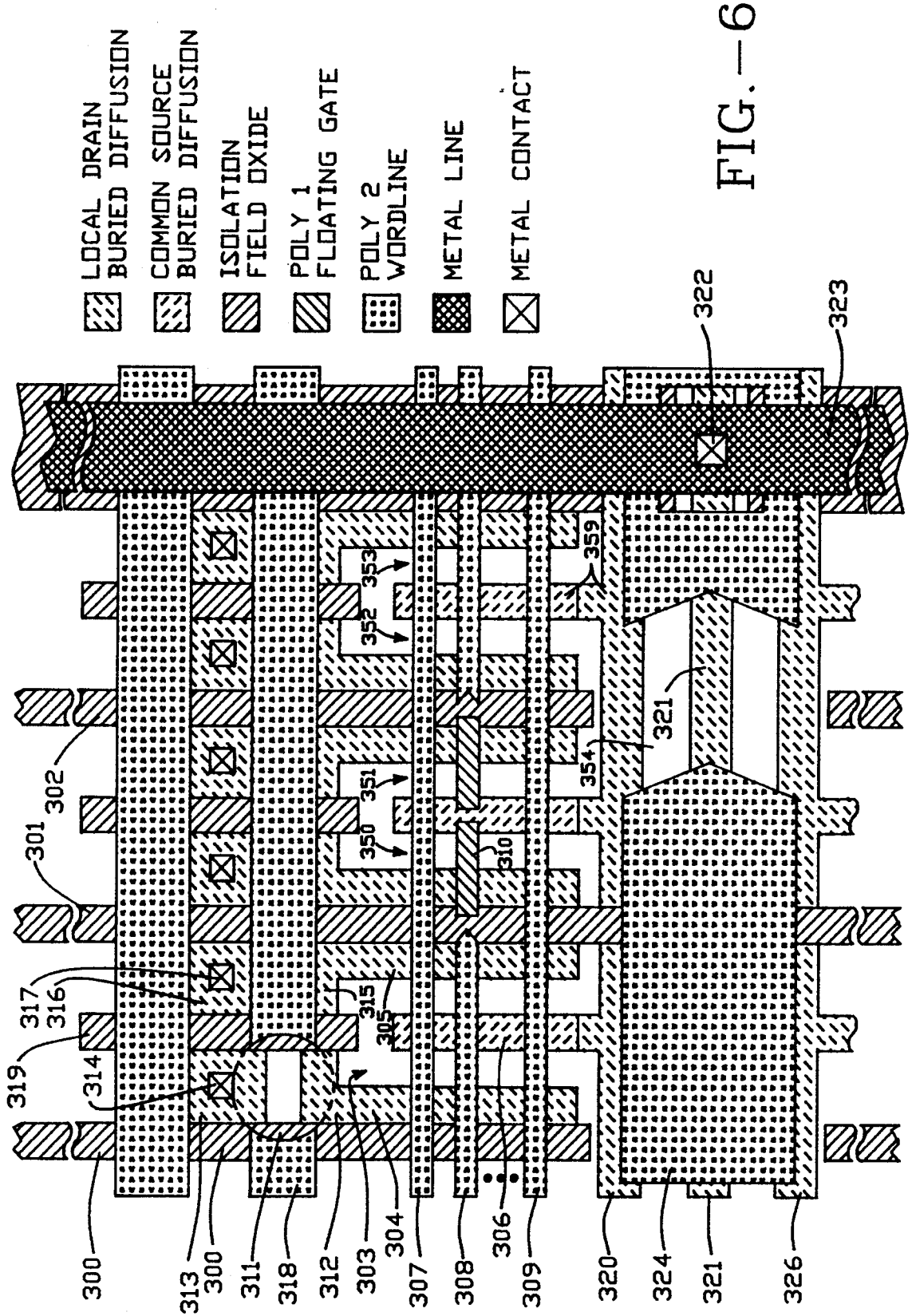
FIG.—6

FLOATING GATE OR FLASH EPROM TRANSISTOR ARRAY HAVING CONTACTLESS SOURCE AND DRAIN DIFFUSIONS

This application is a continuation of application Ser. No. 07/823,882, filed Jan. 22, 1992, now abandoned.

BACKGROUND OF THE INVENTION

1. Field Of the Invention

The present invention relates to non-volatile digital memories, and more particularly, to improved FLASH EPROM memory technology.

2. Description of Related Art

FLASH EPROMs are a growing class of non-volatile storage integrated circuits. These FLASH EPROMs have the capability of electrically erasing, programming or reading a memory cell in the chip. The memory cells in a FLASH EPROM are formed using so-called floating gate transistors in which the data is stored in a cell by charging or discharging the floating gate. The floating gate is a conductive material, typically made of polysilicon, which is insulated from the channel of the transistor by a thin layer of oxide or other insulating material, and insulated from the control gate or wordline of the transistor by a second layer of insulating material.

The act of charging the floating gate is termed the "program" step for a FLASH EPROM. This is accomplished through so-called hot electron injection by establishing a large positive voltage between the gate and source, as much as twelve volts, and a positive voltage between the drain and source, for instance, seven volts.

The act of discharging the floating gate is called the "erase" function for a FLASH EPROM. This erase function is typically carried out by a Fowler-Nordheim (F-N) tunneling mechanism between the floating gate and the source of the transistor (source erase) or between the floating gate and the substrate (channel erase). For instance, a source erase operation is induced by establishing a large positive voltage from the source to gate, while floating the drain of the respective memory cell. This positive voltage can be as much as twelve volts.

Details concerning the structure and function of prior art FLASH EPROMS can be seen upon review of the following U.S. Patents which are incorporated by reference for the purpose of teaching the background of related technology:

Mukherjee, et al., U.S. Pat. No. 4,698,787 issued Oct. 6, 1987;

Holier, et al., U.S. Pat. No. 4,780,423 issued Oct. 25, 1988.

More advanced technology concerning FLASH EPROM integrated circuits in set out in Woo, et al., "A Novel Memory Cell Using Flash Array Contactless EPROM (FACE) Technology" IEDM 1990, Published by the IEEE, pages 91–94. Also, Woo, et al., A Poly-Buffered "FACE" Technology for High Density Memories", 1991 SYMPOSIUM ON VLSI TECHNOLOGY, page 73–74. One prior art "contactless" array EPROM architecture is described in Kazerounian, et al., "Alternate Metal Virtual Ground EPROM Array Implemented In A 0.8 $\mu$M Process for Very High Density Applications", IEDM, published by IEEE 1991, pages 11.5.1–11.5.4.

As evidenced by the Woo, et al. and Kazerounian, et al. publications, there is increasing interest in contactless array non-volatile memory design. So-called contactless arrays include an array of storage cells which are coupled to one another by buried diffusion, and the buried diffusion is only periodically coupled through contacts to a metal bitline. Earlier FLASH EPROM designs such as the Mukherjee, et al. system required a "half" metal contact for each memory cell. Because metal contacts use a significant area on an integrated circuit, they are a major impediment to creating a high density memory technology. Furthermore, as the device becomes smaller and smaller, the area reduction becomes limited by the metal over contact pitches of adjacent drain and source bitlines used to access the storage cells in the array.

Therefore, it is desirable to provide a FLASH EPROM cell, EPROM architecture, and a method of fabricating the same which results in a high density non-volatile memory circuit.

SUMMARY OF THE INVENTION

The present invention provides novel contactless FLASH EPROM cell and array designs, and methods for fabricating the same which results in a dense, segmentable FLASH EPROM chip. The FLASH EPROM cell is based on a unique drain-source-drain configuration, in which the single source diffusion is shared by two columns of transistors. Also a new memory circuit architecture suited for the FLASH EPROM cells of the present invention is provided.

Thus, according to one aspect of the present invention, a floating gate transistor array is provided. An elongated first drain diffusion region, an elongated source diffusion region, and an elongated second drain diffusion region, are formed in a semiconductor substrate along essentially parallel lines. Field oxide regions are grown on opposite sides of the first and second drain diffusion regions. Floating gates and control gate wordlines are formed orthogonal to the drain-source-drain structure to establish two columns of storage cells having a shared source region. The shared source region is coupled through a bottom block select transistor to a virtual ground terminal. Each drain diffusion region is coupled through a top block select transistor to a global bitline. The cell structure according to this aspect of the invention uses two metal global bitlines which extend essentially parallel to the drain, source and drain diffusion regions, and a virtual ground supply which couples a plurality of columns of transistors to a virtual ground terminal through a horizontal conductor, such as a buried diffusion line. Thus, only two metal contact pitches are required per two transistor cell.

According to another aspect of the invention, a plurality of these drain-source-drain blocks are coupled into a large integrated circuit array, to provide high density non-volatile storage. This non-volatile storage is segmentable along block boundaries using the top and bottom block select transistors, which allows for segmented erase operations. Also, the block select feature couples a single block of memory cells to a global bitline at a time. This results in improved resistance to leakage currents in transistors along a given column of the array.

Thus, a memory circuit is provided which comprises K subarrays having N columns and M rows of storage cells each. Storage cells in the columns of storage cells having respective first terminals, second terminals and control terminals. A plurality of wordlines coupled to the control terminals of the storage cells in respective rows is provided. N global bitlines, one corresponding to each column of storage cells, and a plurality of local bitlines, each coupled to the first terminals of the M storage cells in respective columns within a respective subarray are provided. Top block select transistors selectively connect the local bitlines in a subarray of storage cells to corresponding global bitlines in response to subarray select signals. Further included are plurality of local virtual ground lines, each coupled to the second terminals of storage cells in columns with a respective subarray, and means for connecting the local virtual ground lines in the subarray to a virtual ground terminal. Column select transistors coupled to the global bitlines, selectively enable access to the N columns of storage cells.

In addition to the cell and architecture outlined above, a method of fabricating an array of floating gate devices is provided. A first method comprises:

- defining a plurality of drain diffusion regions elongated in a first direction;
- doping the drain diffusion regions;
- establishing a tunnel insulating material on the substrate at least in regions adjacent the drain diffusion regions;
- establishing a floating gate conductive material over the tunnel insulating material at least in regions adjacent the drain diffusion regions;
- establishing a control gate insulating material over the floating gate conductive material;
- exposing elongated source diffusion regions through the floating gate conductive material in the substrate, and aligned with the floating gate conductive material;
- doping the source diffusion regions;
- establishing an insulating layer over the source diffusion regions and any exposed floating gate conductive material; and
- forming a plurality of rows of conductive material over the control insulating material and floating gate conductive material.

A second method for fabricating the integrated circuit comprises:

- establishing tunnel insulating material over the substrate at least in elongated channel regions;
- establishing a floating gate conductive material over the tunnel insulating material at least in the elongated channel regions;
- establishing a control gate insulating material over the floating gate conductive material;
- exposing elongated source diffusion regions and drain diffusion regions in the substrate, aligned with the floating gate conductive material;
- doping the drain diffusion regions with a first distribution of dopants;
- doping the source diffusion region with a second distribution of dopants;
- growing an insulating layer over the source and drain diffusion regions and any exposed floating gate conductive material; and
- forming a plurality of rows of conductive material over the control insulating material and floating gate conductive material.

According to the first method, the source diffusion regions in the cell structures are self-aligned to the floating gate transistors in adjacent columns of transistors. The drain diffusion regions are likewise self-aligned to the insulating region on opposite sides of each block. According to the second method, both the drain and source diffusion regions are self-aligned to the floating gate. Furthermore, the source is implanted with dopant distributions which provide a gradual junction to facilitate tunneling during source erase operations.

Other aspects and advantages of the present invention can be seen upon review of the figures, the detailed description, and the claims which follow.

BRIEF DESCRIPTION OF THE DRAWINGS

FIG. 3 is a diagram of a FLASH EPROM integrated circuit according to the present invention.

FIGS. 4A through 4H are cross-sectional views taken along a wordline in the FLASH EPROM circuit according to the present invention illustrating a first fabrication method and first cell type.

FIGS. 5A through 5G are cross-sectional views taken along a wordline of a second type memory cell according to the present invention, illustrating a second fabricating method.

FIG. 6 is a top view of a FLASH EPROM subarray manufactured according to the method of FIGS. 4A through 4H.

DETAILED DESCRIPTION

Figure 1:
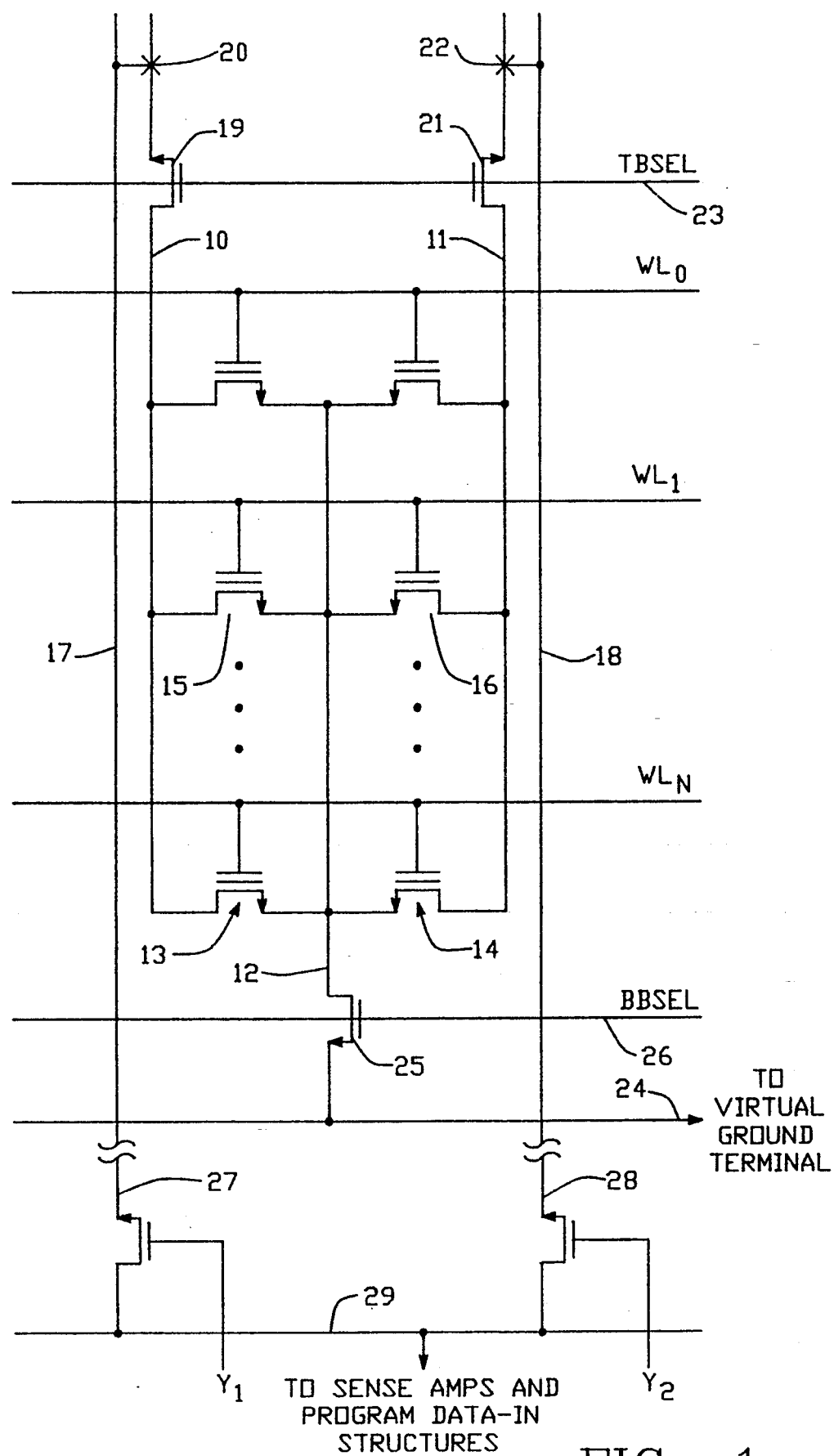
FIG. 1 is a circuit diagram of a FLASH EPROM circuit according to the present invention.
Figure 2:
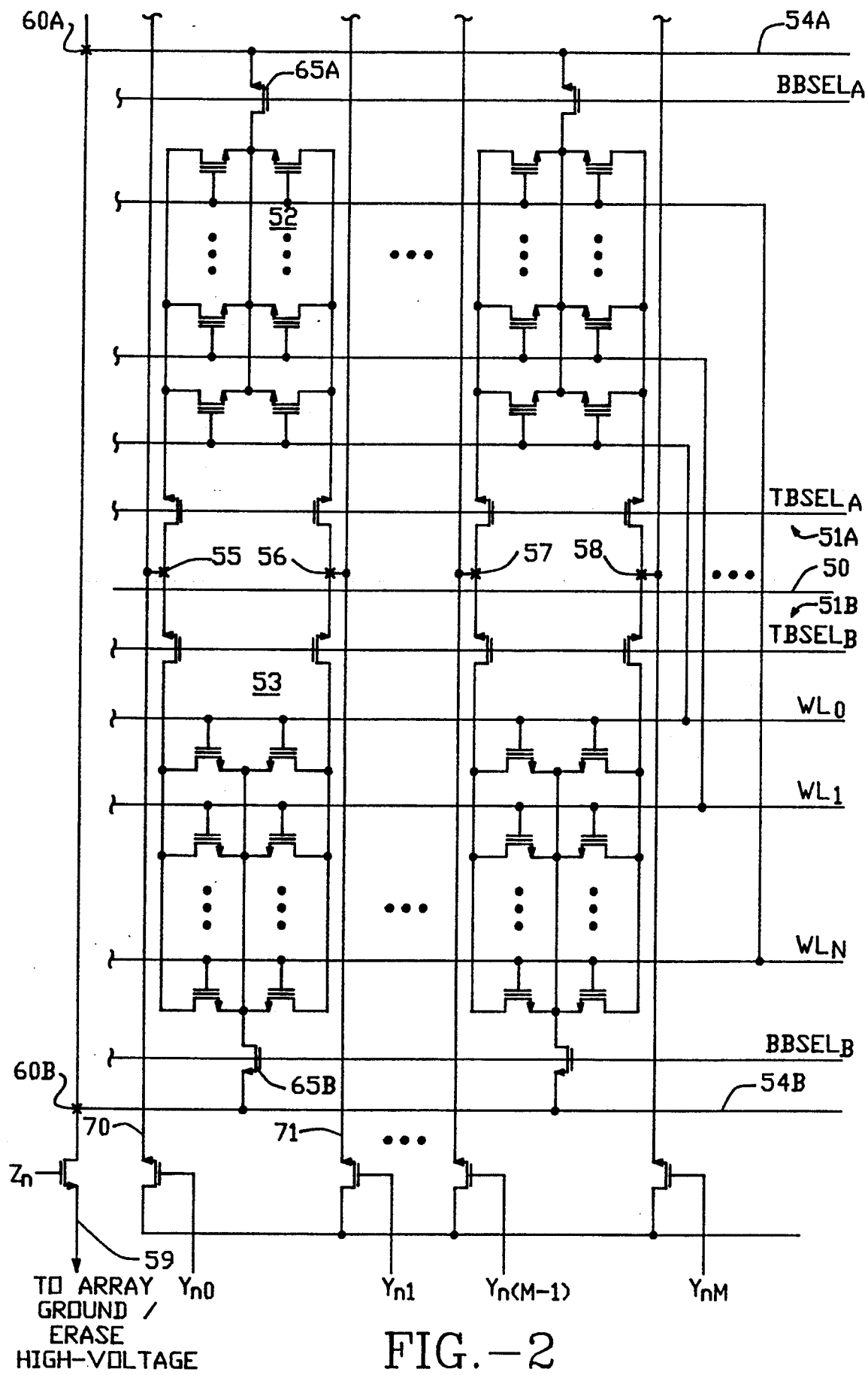
FIG. 2 is a schematic diagram illustrating the layout of two subarrays of FLASH EPROM cells according to the present invention.

A detailed description of preferred embodiments of the present invention is provided with respect to FIGS. 1 through 7. FIGS. 1 through 3 provide a circuit diagram view of a FLASH EPROM architecture according to the present invention. FIGS. 4A–4H, 5A–5G and 6 illustrate first and second FLASH EPROM cell types according to the present invention, and methods for fabricating same.

FIG. 1 illustrates the drain-source-drain configuration of the FLASH EPROM circuit according to the present invention. The circuit includes a first local bitline 10 and a second local bitline 11. The first and second local bitlines 10, 11 are implemented by buried diffusion conductors as described below. Also included is a local virtual ground line 12 implemented by buried diffusion. A plurality of floating gate transistors having gates, drains and sources are coupled to the local bitlines 10, 11 and local virtual ground line 12. The sources of the plurality transistors are coupled to the local virtual ground line 12. The drains of a first column of transistors, generally 13, are coupled to the first local bitline 10, and the drains of a second column of transistors, generally 14, are coupled to the second local bitline 11. The gates of the floating gate transistor are coupled to wordlines $WL_0$ through $WL_N$, where each wordline (e.g., $WL_1$) is coupled to the gate of a transistor (e.g., transistor 15) in the first column 13 and a transistor (e.g., transistor 16) in the second column 14. Thus, transistors 15 and 16 can be considered a two transistor cell with a shared source diffusion.

The act of charging the floating gate is called the program step for the FLASH EPROM cell. This is accomplished through hot electron injection by establishing a large positive voltage between the gate and the source, such as twelve volts, and a positive voltage between the drain and the source, such as six volts.

The act of discharging the floating gate is called the erase step for the FLASH EPROM cell. This is accomplished through F-N tunneling mechanism between the floating gate and the source (source erase) or between the floating gate and the substrate (channel erase). The source erasing is performed by applying a positive bias to the source, such as twelve volts or eight volts, while the gate is grounded or negatively biased, such as minus eight volts. The channel erasing is performed by applying a negative bias to the gate and/or a positive bias to the substrate.

A first global bitline 17 and a second global bitline 18 are associated with each drain-source-drain block as shown in FIG. 1. The first global bitline 17 is coupled to the source of top block select transistor 19 through a metal-to-diffusion contact 20. Similarly, the second global bitline 18 is coupled to the source of top block select transistor 21 through a metal-to-diffusion contact 22. The drains of the top block select transistors 19, 21 are coupled to the first and second local bitlines 10 and 11, respectively. The gates of the top block selector transistors 19, 21 are controlled by a top block select signal TBSEL on line 23.

The local virtual ground line 12 is coupled to a virtual ground terminal across conductor 24 through bottom block selector transistor 25. The drain of the bottom block select transistor 25 is coupled to the local virtual ground line 12. The source of the bottom block select transistor 25 is coupled to the conductor 24. The gate of the bottom block select transistor 25 is controlled by a bottom block select signal BBSEL across line 26. In the preferred system, the conductor 24 is a buried diffusion conductor which extends to a metal-to-diffusion contact at a position displaced horizontally through the array, which provides contact to a vertical metal virtual ground bus.

The global bitlines extend vertically through the array to respective column select transistors 27, 28, through which a selected global bitline is coupled to sense amps and program data circuitry (not shown). Thus, the source of column select transistor 27 is coupled to global bitline 17, the gate of column select transistor 27 is coupled to a column decode signal $Y_1$, and the drain of the column select transistor 27 is coupled to conductor 29.

The blocks of FLASH EPROM cells as shown in FIG. 1 are configured into a plurality of subarrays as illustrated in FIG. 2. FIG. 2 illustrates two subarrays within a larger integrated circuit. The subarrays are divided generally along dotted line 50 and include subarray 51A generally above the line 50 and subarray 51B generally below the line 50. A first block 52 is laid out in a mirror image with a second block 53 along a given bitline pair (e.g., bitlines 70, 71). As one proceeds up the bitline pair, the memory subarrays are flipped so as to share virtual ground conductors 54A, 54B (buried diffusion) and metal-to-diffusion contacts 55, 56, 57, 58. The virtual ground conductors 54A, 54B extend horizontally across the array to a vertical virtual ground metal line 59 through metal-to-diffusion contacts 60A, 60B. The subarrays repeat on opposite sides of the metal virtual ground line 59 so that adjacent subarrays share a metal virtual ground line 59. The metal virtual ground line 59 is coupled to array ground and erase high-voltage circuitry through a virtual ground select transistor 79 controlled by decoded signal $Z_n$. The virtual ground select transistor 79 can be used to isolate areas of the array sharing metal line 59 from high-voltage erases. Thus, the subarray layout requires two metal contact pitches per column of two transistor cells for the global bitlines and one metal contact pitch per subarray for the metal virtual ground line 59.

Furthermore, two subarrays as illustrated in FIG. 2 may share wordline signals because of the additional decoding provided by the top and bottom block select signals TBSELA, TBSELB, BBSELA, and BBSELB.

In one preferred system, each subarray includes 8 blocks 32 two transistor cells and wordlines deep, so that there are a total of 16 global bitlines and 32 wordlines, providing a 512 cell subarray.

As can be seen, the architecture according to the present invention provides a sectored FLASH EPROM array. This is beneficial because the source and drain of transistors in non-selected subarrays during a read, program or erase cycle may be isolated from the currents and voltages on the bitlines and virtual ground lines. Thus, during a read operation, sensing is improved because leakage current from subarrays not selected does not contribute to current on the bitlines. During the program and erase operations, the high voltages of the virtual ground line, and the bit lines, are isolated from the unselected blocks. This allows a sectored erase operation.

It will be appreciated that the bottom block select transistors (e.g., transistors 65A, 65B) may not be necessary in a given implementation. Also, these block select transistors may share a bottom block select signal with an adjacent subarray, as illustrated below with respect to FIG. 6. Alternatively, the bottom block select transistors (e.g., 65A, 65B) may be replaced by single isolation transistors adjacent the virtual ground terminals 60A, 60B.

FIG. 3 is a schematic block diagram of a FLASH EPROM integrated circuit according to the present invention. The FLASH EPROM includes a memory array 100 implemented as shown in FIG. 2. A plurality of redundant cells 101 is implemented in the preferred system so that any failed cells in the memory array may be replaced by redundant cells 101. In addition, the circuit includes a plurality of reference cells 102, block 103 which includes sense amps, program data-in circuits, and array ground and erase high-voltage circuits, and block 104 which includes word line and block select decoders, and block 105 which includes column decoders and virtual ground decoders. The reference cells are coupled to sense amplifiers in block 103 to account for variations in channel length, and the like, which may occur during fabrication and be reflected in the voltages or currents on the bitlines being sensed. The reference cells 102 may also be used in the generation of program and erase voltages. This redundant cell architecture is made possible by the segmented architecture of the FLASH EPROM arrays as discussed above.

The wordline and block select decoders 104 and the column and virtual ground decoder 105 are programmable after testing so that redundant cells may replace inoperable cells in the memory array 100.

In addition, the circuit includes a mode control circuit 106 for controlling the erase, program and read operations, and the virtual ground, drain and wordline voltages used during the various operations.

The FLASH EPROM cells and the methods for fabricating the cells used in the circuits described above are illustrated with respect to FIGS. 4A through 4H in one embodiment, and with respect to FIGS. 5A through 5G in a second embodiment. A top view of a section of the integrated circuit is illustrated with respect to FIG. 6.

A first cell type is implemented as shown in FIGS. 4A–4H, which illustrate the primary steps involved in manufacturing the cell.

Figure 4A:
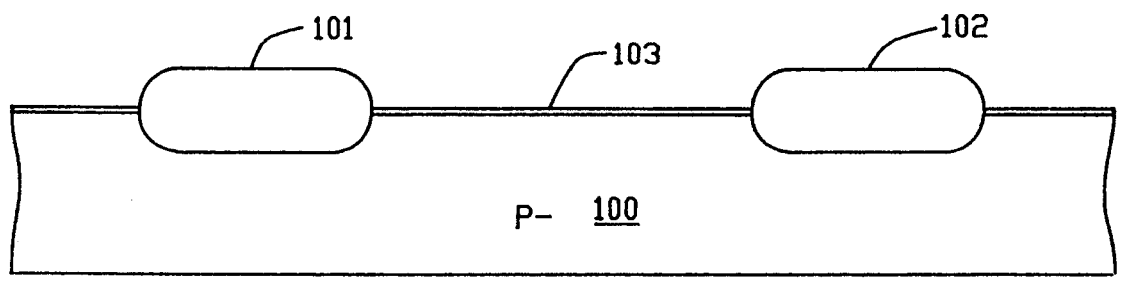

FIG. 4A illustrates a first step in the process. Starting with a P-silicon substrate 100, for making an n-channel cell, a well known LOCOS field oxidation process is used to grow relatively thick field oxide regions 101, 102 which are elongated in a direction perpendicular to the page. Also, a thin oxide layer 103 is grown over the regions outside the field oxides 101 and 102.

Figure 4B:
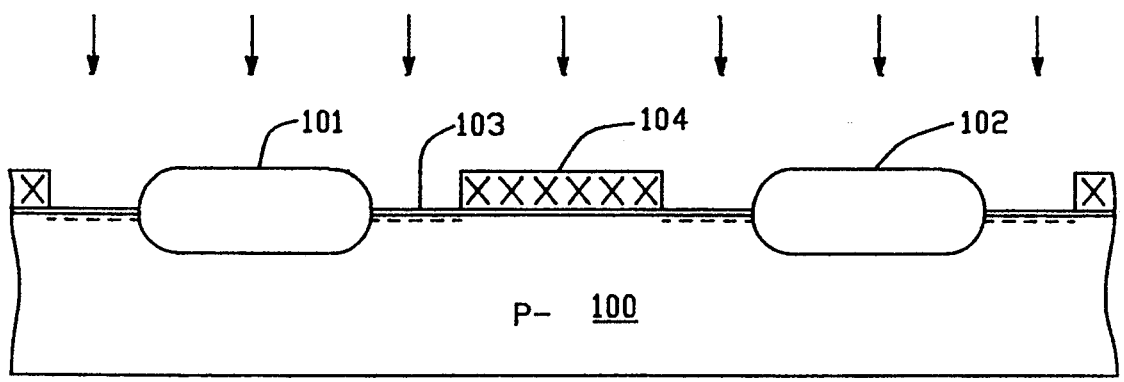
Figure 4C:
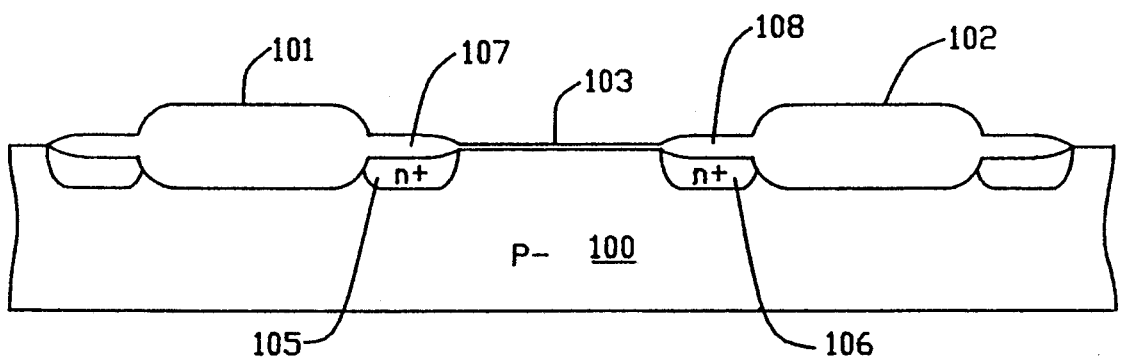

As illustrated in FIG. 4B, in the next step a photoresist mask is deposited between the field oxides 101 and 102, and elongated along a line essentially parallel to the field oxide regions 101,102. This defines drain diffusion regions between the field oxide 101 and photoresist mask 104, and between the field oxide 102 and photoresist mask 104. An n-type dopant is implanted, as schematically represented by arrows, through the thin oxides 103 into the substrate 100. Thus, the drain diffusion regions are self-aligned with the isolation field oxides 101 and 102.

In the next step, the photoresist mask 104 is removed, and the substrate is annealed to drive in and activate the n-type dopant to form n+ local bitlines 105 and 106. Also, a drain oxide 107, 108 is grown over the diffusion bitlines 105 and 106.

Figure 4D:
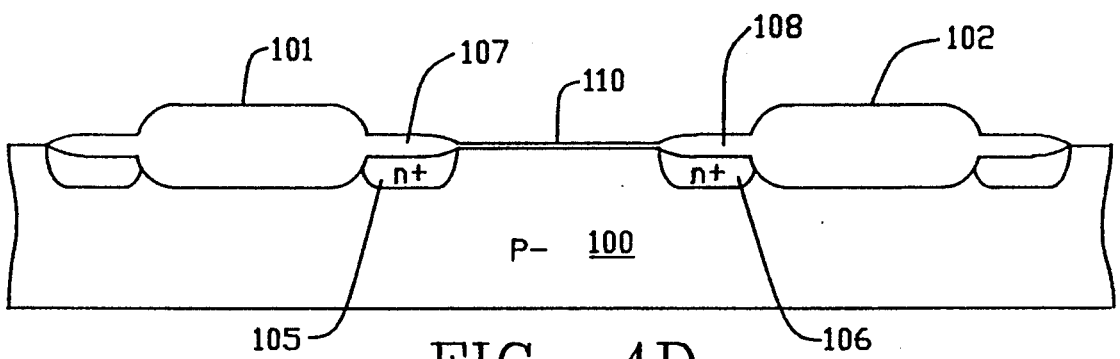

FIG. 4D illustrates a next step in the fabrication of the cell. In particular, the thin oxide 103 is removed by a blank wet etch, and a tunnel oxide 110 is grown in its place between the drain diffusion bitlines 105, 106. The tunnel oxide 110 in the preferred system is approximately 100 angstroms thick. The tunnel oxide 110, but may be less than about 120 angstroms for a FLASH EPROM cell. Thicker oxides may be used for non-volatile cells, such as UV-EPROM cells, that do not use tunneling for the erase operation.5

The oxides 107, 108 over the buried drain diffusion lines 105, 106 are approximately 1000 angstroms thick at this step.

The next step as shown in FIG. 4E is to deposit a first layer of polysilicon 111, and dope the polysilicon so that it is conductive. Then, an oxide/nitride/oxide (ONO) layer 112 is grown over the first poly layer 111 to provide control gate insulation. In this step, the poly 1 layer is approximately 1500 angstroms thick and the ONO layer is approximately 250 angstroms thick.

In FIG. 4F, a self-aligned source diffusion region is defined using a photo masking process. After the photo masking process, the poly 111 and the ONO insulation 112 are etched to expose the source diffusion regions. Also, the floating gate poly 111 and ONO layer 112 are etched to define the width of the floating gate. Thus, one side of the etched poly 1 defines a side of the source diffusion region, and the second side defines the width of the floating gate. In this embodiment, the second side is located over the field oxide region 101 or 102.

The source diffusion regions are then implanted with n-type dopants to form a n+/n− double-diffused diffusion region which is elongated and parallel with the drain diffusion regions 105, 106. The dopants used are phosphorous and arsenic together to form the double diffusion.

As illustrated in FIG. 4G, the photoresist is removed, and the substrate is annealed to drive in the n+ and n− dopants and activate the source diffusion region 115. Also, a source oxide 116 is grown, and oxides 117 are grown along the sides of the floating gates poly 111 to isolate the floating gates from the wordline poly to be defined later.

FIG. 4H illustrates a next step in the process of manufacturing the FLASH EPROM cell. This involves depositing the second layer of poly 118 and using a photo masking process to define the wordlines. In the photo masking process, the etch defining the wordlines is continued through the floating gate poly 111 to define the floating gates for respective transistors. The wordline 118 is approximately 4,500 angstroms thick. Finally, passivation and metalization layers (not shown) are deposited over the cells.

As can be seen in FIG. 4H, the cell structure results in a first transistor between drain diffusion line 105 and source diffusion line 115, and a second transistor between drain diffusion line 106 and source diffusion line 115. The floating gates extend from the source diffusion line 115 across the drain diffusion line 105 and over the field oxide 101. In a preferred embodiment, these floating gate oxides are approximately 2.4 microns long and 0.8 microns in width, while the width of the tunnel oxide 110 over a given transistor from the edge of drain oxide 107 to the edge of source oxide 116 is approximately 1.2 microns. The extra area over the drain diffusion line 105 and the field oxide 202 is used to increase the coupling ratio through the floating gate to greater than about 50%. Because the ONO layer is approximately 250 angstroms thick and the tunnel oxide is approximately 100 angstroms thick, the coupling ratio must be improved by increasing the area of the floating gate. Alternatively, the ONO layer could be manufactured thinner to reduce the area needed for the floating gate.

As can be seen, the source diffusion is accomplished in a step independent of the drain diffusion, and is implemented with a different distribution of dopants in order to establish a gradual junction in a channel of the respective transistors to facilitate the source erase function. In a channel erase type or uverase type floating gate, the gradual junction and the source diffusion may not be necessary.

FIGS. 5A through 5G illustrate implementation of a second cell type according to the present invention. As illustrated in FIG. 5A, the first step involves growing field oxide regions 201, 202 such as described above with respect to FIG. 4A. Also, a sacrificial oxide layer is grown and then removed to prepare the substrate 200 for growing a thin tunnel oxide. As illustrated in FIG. 5B, a thin tunnel oxide 203 is grown about 100 angstroms thick. In the next step, the poly 1 layer is deposited and doped, and then an ONO layer 205 about 120 angstroms thick is grown so that the coupling ratio is greater than about 50%. Thicker thin oxide 203 and ONO 205 layers are used for UV-EPROM cells.

In FIG. 5D, a photo masking process is used to define floating gates, and the n+ source and drain diffusion regions. Thus, a photo mask layer 206 and 207 are defined to protect the floating gate regions. The poly 1 204 and ONO 205 layers are etched away except as protected by the masks 206 and 207 to expose the drain, source and drain regions. Next, the n-type dopants are implanted as illustrated at arrows 208 within the exposed regions. These regions are therefore self-aligned to the floating gates and field isolation regions.

For a FLASH EPROM array, the next step is illustrated in FIG. 5E. According to this step, a photo masking process is used to define masks 210, 211 which cover the drain regions and isolation regions. In this step, an n— dopant is implanted, represented by arrows 212, so that the source region has an n+ and n— dopants to prepare for performing a gradual junction. The steps in FIG. 5E can be omitted for example in UV erase EPROM cells.

As illustrated in FIG. 5F, the substrate is annealed to activate the dopants and define the drain diffusion regions 213 and 214 and the source diffusion region 215. Also, drain oxides 216, 217 and source oxide 218 are grown, along with oxides covering the sides of the floating gate poly.

Finally, as illustrated in FIG. 5G, the second layer of poly 219 is deposited and etched to define the transistors. In this embodiment, the ONO sandwich 205 has a thickness within about plus or minus 20% of the thickness of the tunnel oxide so that the coupling ratio is high enough (within a range of about 40% to about 60%, and preferably about 50%) without the necessity of using a floating gate extended over the drain and field isolation regions. Finally, passivation and metalization layers (not shown) are deposited over the circuit of FIG. 5G.

Thus, as can be seen in FIG. 5G, the cell structure according to the second type includes a first transistor between the buried drain diffusion region 213 and the buried source diffusion region 215, and a second transistor between the buried drain diffusion region 214 and the buried source diffusion region 215. Each of the transistors includes a floating gate implemented with the first layer of poly 204. The floating gate is insulated from the channel region of the respective transistor by the tunnel oxide 203 and insulated from the control gate in the wordline poly 219 by an ONO layer to 205. The ONO layer 205 has a thickness within about + or − 20% of the thickness of the tunnel oxide 203 to insure a sufficiently high coupling ratio for FLASH EPROM operation. Because of the thickness of the ONO layer 205 in the cell type illustrated with respect to FIGS. 5A through 5G is sufficiently thin, the surface area of the floating gate does not need to be extended as done in the first type of cell structure illustrated with respect to FIGS. 4A though 4H. Furthermore, in the structure as illustrated in FIG. 5G, the first and second drain diffusion regions 213, 214 and the source diffusion region 215 are all self-aligned with the floating gate structure implemented by the first layer of poly 204 and the ONO insulating layer 205. This insures that the channel length of the respective transistors is substantially equal.

In FIG. 6, a layout view of subarrays of the integrated circuit EPROM is provided, for the EPROM cells illustrated in FIG. 4H. It will be understood that the layout is substantially the same for cells implemented as shown in FIG. 5G, with the exception of the size of the floating gate viewed from the top perspective. Thus, as can be seen in FIG. 6, the integrated circuit includes a plurality of elongated isolation regions 300, 301, 302 which extend vertically through the subarray. These isolation regions correspond to the thick oxides 101 and 102 in FIG. 4H. These field oxides 300, 301 define an isolated region, generally 303 in between them. Within the isolated region are a first elongated buried diffusion line 304 and a second elongated buried diffusion line 305 which correspond to the diffusion lines 105 and 106 of FIG. 4H. In between the elongated buried diffusion lines, lies an elongated source diffusion line 306 which corresponds to the diffusion line 115 of FIG. 4H. A plurality of wordlines 307, 308 . . . 309 intersects the isolated regions to define the control gates of the floating gate transistors in the array. Floating gates, (e.g., see cutaway 310) overlie the substrate between the respective wordline in the tunnel oxide.

The top block select transistors are coupled to each of the buried diffusion lines 304, 305 which define local bitlines. The block select transistors, e.g., in the region 311, have a drain 312 which is coupled with the elongated buried diffusion region 304 and a source 313 which is coupled through a metal-to-diffusion contact 314 to a metal line (not shown) which extends parallel with the isolation region 300 over the subarray. Similarly, the second buried diffusion line 305 is coupled to the drain 315 of a top block select transistor which has its source 316 coupled to a metal-to-diffusion contact 317 and through the contact to the vertical metal line (not shown) acting as a global bitline. The gates of the top block select transistors are established by the top block select wordline 318 which extends horizontally across the array. The top block select transistor which couples the local bitline 304 to the metal-to-diffusion contact 314 is isolated from the block select transistor which couples the local bitline 305 to the metal-to-diffusion contact 317 by a field oxide region 319. Thus, each column of transistors can be selected independently for read and program operations.

The local source diffusion 306 is coupled to a bottom block select transistor having a buried diffusion source 320 and a buried diffusion drain 321. The buried diffusion drain is an elongated buried diffusion conductor which extends horizontally across the array to a metal-to-diffusion contact 322, which the in turn is connected to the metal line 323 which supplies the virtual ground voltage to the array. The bottom block select transistors are controlled by the poly 2 select line 324. As can be seen, the poly 2 select line 324 is shared by the subarray illustrated in the figure and a subarray 325 generally below the figure. The subarray 325 includes a block select source region 326 which shares the buried diffusion drain 321 that connects the subarray to the virtual ground bus. Thus, the poly 2 bottom block select signal is supplied across a wide structure 324 which extends from the source region 320 in the first subarray to the source region 326 in the second subarray 325. In this way, the bottom block select signal operates to enable the local virtual ground diffusions 306 for subarrays on each side of the drain diffusion region 321.

Of course, alternative embodiments could be implemented where the bottom block select signal is individually controlled for each subarray requiring separate block select signal wordlines 324 for each subarray. Also, the bottom block select transistors could be implemented, one for each buried diffusion line, in a manner similar to the top block select transistors. In another alternative, the bottom block select transistor could be replaced by conductor with a single isolated transistor near the metal-to-diffusion contact 322 controlling a plurality of local virtual ground bitlines.

An isolation region, e.g., isolation region 301, periodically extends through the bottom block select source region 320 and drain region 321 to isolate the bottom block select transistor in adjacent subarrays.

As can be seen, a virtual ground metal bus 323 extends vertically across the figure. It is coupled to the bottom block select transistors at the metal-to-diffusion contact 322.

The isolation region 301 separates subarrays on either side of the field oxide 301 by isolating the bottom block select transistors. As shown in FIG. 6, a subarray would thus include the four (for example) columns of transistors 350, 351, 352, 353, all sharing a common bottom block select transistor generally in the region 354. Preferred systems may include 16 columns of transistors (8 blocks of two transistor cells) per subarray. The transistors formed by the diffusion regions 304, 305 thus lie in a separate subarray from the transistors in columns 350 and 351. Transistors lying to the right of the virtual ground metal line 323 would also lie in a separate subarray. Because of the shared bottom block select transistors controlled by the bottom block signal on line 324, four subarrays (two on each side of the metal 323) will have their source diffusion regions, e.g., 359, coupled to the virtual ground bus 323 in response to a signal on line 324. This results in sectored erase for four subarrays at a time.

In conclusion, there are several distinct features of the non-volatile memory design of the present invention. First, the metal-pitch constraint of adjacent drain and source bitlines is relaxed by the shared common source (virtual ground) bitlines, which are coupled to only one metal source line running parallel with every 16, 32, or more, metal drain contact lines or global bitlines. This allows a very dense core array to be achieved. Second, the FLASH EPROM array is divided into subarrays, while it is selected by fully decoded block select lines. Thus sector erase becomes feasible, and disturbance of a memory cell only occurs while its corresponding subarrays are selected. This should greatly improve product performance and the reliability. Third, as to the first cell type in FIGS. 4A through 4G, the source side of the cell is not subjected to numerous oxidation cycles, so that the source junction edge should maintain very good integrity. More particularly, the source junction edge should not suffer the dopant depletion and oxide edge thickening effects of cells designed according to prior art techniques which involve more extensive oxidation cycles after source implants. For this reason, a better source erase performance of the new cells is expected. Furthermore, a reasonably high gate coupling ratio can be realized through the unique cell layout where the floating gate polysilicon layer extends over the drain and field oxide regions, significantly increasing the coupling area of the control gate to the floating gate polysilicon.

As to the second cell design illustrated with respect to FIGS. 5A through 5G, the drain-source-drain configuration of the present invention can be achieved with self-aligned process for both the drain and source diffusion, yielding a substantially uniform channel length for all the memory cell transistors in the array.

Thus, a new FLASH EPROM cell and array architecture have been provided. Some key features of the new cell designs include:

1. A very dense core array obtained by unique cell layouts, where two adjacent local drain bitlines share one common source bitline, and only one metal source bitline runs parallel with every subarray of cells;
2. Sector erase is now feasible using the segmentable architecture of the present invention; and
3. A high performance and reliable flash memory array can be achieved.

An n-channel embodiment of the FLASH EPROM array has been disclosed. Those skilled in the art will recognize a p-channel equivalent circuit can be implemented using techniques known in the art. Furthermore, the architecture has been designed with respect to the FLASH EPROM cells. It can be adapted to any memory circuit array. Thus, the storage cells in the memory array may be implemented using ROM technology, PROM technology, EPROM technology, UV erase EPROM technology or other EPROM technology. Furthermore, the FLASH EPROM disclosed has been implemented for the purposes of source erase operations. It can be adapted to channel erase operations if desired.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A flash EPROM transistor array, comprising a semiconductor substrate of a first conductivity type; a contactless drain diffusion region of a second conductivity type in the substrate and elongated in a first direction and having a drain width transverse to the first direction;
    a contactless source diffusion region of the second conductivity type in the substrate, elongated in the first direction, and spaced away from the drain diffusion region to provide channel region between the source and drain diffusion regions;
    a first insulating layer over the substrate, over the channel region, and over the source and drain diffusion regions;
    a plurality of floating gate electrodes overlying the first insulating layer over the channel region;
    a second insulating layer over the plurality of floating gate electrodes;
    a plurality of control gate electrodes over the second insulating layer elongated in a second direction intersecting the source and drain diffusion regions over respective floating gate electrodes, to form a plurality of flash EPROM transistors across the channel region
    a data conductor; and
    a transistor having a first terminal coupled to the contactless drain diffusion region, a second terminal contacting the data conductor, and a gate terminal connected to a control signal line, by which the transistor connects or disconnects the data conductor to or from the contactless drain diffusion region in response to the control signal.

2. A flash EPROM transistor array, comprising:
    a semiconductor substrate of a first conductivity type;
    a contactless drain diffusion region of a second conductivity type in the substrate and elongated in a first direction;
    a contactless source diffusion region of the second conductivity type in the substrate, elongated in the first direction, and spaced away from the drain diffusion region to provide channel region between the source and drain diffusion regions;

a first insulating layer over the substrate, over the channel region, and over the source and drain diffusion regions;

a plurality of floating gate electrodes overlying the first insulating layer over the channel region;

a second insulating layer over the plurality of floating gate electrodes;

a plurality of control gate electrodes over the second insulating layer elongated in a second direction intersecting the source and drain diffusion regions over respective floating gate electrodes, to form a plurality of flash EPROM transistors across the channel region; and a relatively thick insulating region, contacting the first insulating layer, against the drain diffusion region and elongated in the first direction, isolating the drain diffusion region from other structures in the substrate.

3. The array of claim 2, wherein the thick insulating region extends into the substrate to a depth sufficient to prevent parasitic channels between the drain diffusion region and other structures in the substrate.

4. The array of claim 1, wherein the source diffusion region includes a shallower region doped with arsenic, and a deeper region doped with phosphorous.

5. The array of claim 1, wherein a given flash EPROM transistor in the plurality of flash EPROM transistors has a capacitive coupling ratio, and the floating gate electrode of the given flash EPROM transistor consists of a single level polysilicon layer which extends under the control gate electrode over the channel region, over the drain diffusion region, and over a portion of the relatively thick insulation region, to increase a surface area of the floating gate electrode so that the capacitive coupling ratio is increased.

6. The array of claim 1, wherein the flash EPROM transistors in the array have a capacitive coupling ratio, and the first insulating layer has a first thickness over the channel region for Fowler-Nordheim tunneling, and the second insulating layer has a second thickness over the floating gate electrode so that the capacitive coupling ratio is greater than about 40%.

7. The array of claim 2, wherein the flash EPROM transistors in the array have a capacitive coupling ratio, and the first insulating layer has a first thickness over the channel region for Fowler-Nordheim tunneling, and the second insulating layer has a second thickness over the floating gate electrode, wherein the first thickness is less than about 120 angstroms, and the second thickness is within a range of plus or minus 20% of the first thickness.

8. The array of claim 2, wherein the flash EPROM transistors in the array have a capacitive coupling ratio, and the first insulating layer has a first thickness over the channel region for Fowler-Nordheim tunneling, and the second insulating layer has a second thickness over the floating gate electrode, wherein the floating gate electrode has a first major surface adjacent the first insulating layer having a channel surface area over the channel region, and a second major surface adjacent the second insulating layer having a control surface area under the control electrode substantially equal to the channel surface area.

9. The array of claim 1, further including:

means, coupled to the contactless source diffusion region, for supplying a source potential to the contactless source diffusion region; and column select means, coupled to the data conductor, for selectively enabling the data conductor.

10. A floating gate transistor array, comprising:

a semiconductor substrate of a first conductivity type;

a first drain diffusion region in the substrate and elongated in a first direction;

a source diffusion region in the substrate, elongated in the first direction, and spaced away from the first drain diffusion region to provide a first channel region between the source and first drain diffusion regions;

a second drain diffusion region in the substrate and elongated in the first direction, and spaced away from the source diffusion region to provide a second channel region between the source and second drain diffusion regions;

a first insulating layer lying over the substrate over the first and second channel regions, over the source diffusion region, and over the first and second drain diffusion regions;

a first plurality of floating gate electrodes over the first insulating layer over the first channel region;

a second plurality of floating gate electrodes over the first insulating layer over the second channel region;

a second insulating layer over the first and second pluralities of floating gate electrodes;

a plurality of control gate conductors on the second insulating layer elongated in a second direction, each intersecting the source, first drain, and second drain diffusion regions over a floating gate electrode in the first plurality and a floating gate electrode in the second plurality to thereby form a plurality of pairs of floating gate transistors having a shared source diffusion region;

a first bitline conductor and a second bitline conductor;

a first block select transistor having a first channel terminal coupled to the first drain diffusion region, a second channel terminal coupled to the first bitline conductor, and gate electrode coupled to a block select signal;

a second block select transistor having a first channel terminal coupled to the second drain diffusion region, a second channel terminal coupled to the second bitline conductor, and a gate electrode coupled to the block select signal;

means, coupled to the source diffusion region, for supplying a source potential to the source diffusion region; and column select means, coupled to the first and second bitline conductors, for selectively enabling the first and second bitline conductors.

11. The array of claim 10, wherein the first and second drain diffusion regions consist of contactless buried diffusion regions.

12. The array of claim 10, wherein the first and second bitline conductors are elongated in the first direction and insulated from the plurality of control gate conductors.

13. The array of claim 12, further including a first thick insulating region in the substrate adjacent the first drain diffusion region and a second thick insulating region in the substrate adjacent the second drain diffusion region to provide isolated regions in the substrate between the first and second thick insulating regions, wherein the first and second bitline conductors overlie the isolated regions.

14. The array of claim 10, wherein the plurality of floating gate transistors comprise flash EPROM transistors, and the source diffusion region has distribution of dopants providing a gradual channel junction to facilitate source erase.

15. The array of claim 14, wherein the source diffusion region includes a shallower region doped with arsenic, and a deeper region doped with phosphorous to form the gradual channel junction.

16. The array of claim 13, wherein a given floating gate transistor in the plurality of pairs of floating gate transistors has a capacitive coupling ratio, and the floating gate electrode of the given floating gate transistor extends under the control gate electrode and over the channel region, over the drain diffusion region, and over a portion of the relatively thick insulation region, to increase a surface area of the floating gate electrode so that the capacitive coupling ratio is increased.

17. The array of claim 10, wherein a given floating gate transistor in the array has a capacitive coupling ratio, and the first insulating layer has a first thickness over the channel region of the given floating gate transistor for F-N tunneling, and the second insulating layer has a second thickness over the floating gate electrode of the given floating gate transistor so that the coupling ratio is greater than about 40%.

18. The array of claim 17, wherein the first thickness is less than about 120 angstroms and the second thickness is within a range of plus or minus 20% of the first thickness.

19. The array of claim 17, wherein the floating gate electrode has a first major surface adjacent the first insulating layer having a channel surface area over the channel region, and a second major surface adjacent the second insulating layer having a control surface area under the control electrode substantially equal to the channel surface area.

20. A floating gate transistor array, comprising:
a semiconductor substrate of a first conductivity type;
a first relatively thick insulating region in the substrate;
a second relatively thick insulating region in the substrate and spaced away from the first insulating region to provide an isolated region in the substrate;
a first channel terminal diffusion region in the isolated region and elongated in a first direction;
a second channel terminal diffusion region in the isolated region, elongated in the first direction, and spaced away from the first channel terminal diffusion region to provide a first channel region between the second and first channel terminal diffusion regions;
a third channel terminal diffusion region in the isolated region and elongated in the first direction, and spaced away from the second diffusion region to provide a second channel region between the second and third channel terminal diffusion regions;
a first insulating layer over the substrate, over the first and second channel regions, and over first, second and third channel terminal diffusion regions;
a first plurality of floating gate electrodes over the first insulating layer over the first channel region;
a second plurality of floating gate electrodes over the first insulating layer over the second channel region;
a second insulating layer over the first and second pluralities of floating gate electrodes;
a plurality of control gate conductors over the second insulating layer elongated in a second direction, each extending across the first and second thick insulating regions, and the first, second and third channel terminal diffusion regions, and lying over a floating gate electrode in the first plurality and a floating gate electrode in the second plurality, to thereby form a plurality of pairs of floating gate transistors in the isolated region sharing the second channel terminal diffusion region;
a first bitline conductor and a second bitline conductor;
a first block select transistor having a first channel terminal coupled to the first channel terminal diffusion region, a second channel terminal coupled to the first bitline conductor, and a gate electrode coupled to a block select signal;
a second block select transistor having a first channel terminal coupled to the third channel terminal diffusion region, a second channel terminal coupled to the second bitline conductor, and a gate electrode coupled to the block select signal;
means, coupled to the second diffusion region, for supplying a source potential to the second channel terminal diffusion region; and
column select means, coupled to the first and second bitline conductors, for selectively enabling the first and second bitline conductors.

21. The array of claim 20, wherein the first and second bitline conductors are elongated in the first direction and insulated from the plurality of control gate conductors.

22. The array of claim 21, wherein the first and second bitline conductors overlie the isolated regions between the first and second relatively thick insulating regions.

23. The array of claim 20, wherein the first and third channel terminal diffusion regions consist of contactless diffusion regions.

24. The array of claim 20, wherein the plurality of pairs of floating gate transistors comprise flash EPROM transistors, and the source diffusion region has distribution of dopants providing a gradual channel junction to facilitate source erase.

25. The array of claim 24, wherein the source diffusion region includes a shallower region doped with arsenic and a deeper region doped with phosphorous to form the gradual channel junction.

26. The array of claim 20, wherein a given floating gate transistor in the plurality of pairs of floating gate transistors has a capacitive coupling ratio, and the floating gate electrode of the given floating gate transistor extends under the control gate electrode over the channel region, over the drain diffusion region, and over a portion of the relatively thick insulation region, so that the capacitive coupling ratio is increased.

27. The array of claim 20, wherein a given floating gate transistor in the plurality of pairs of floating gate transistors has a capacitive coupling ratio, and the first insulating layer has a first thickness over the channel region of the given floating gate transistor for Fowler-Nordheim tunneling, and the second insulating layer has a second thickness over the floating gate electrode so that the coupling ratio is greater than about 40%.

28. The array of claim 27, wherein the first thickness is less than about 120 angstroms and the second thickness is within a range of plus or minus about 20% of the first thickness.

29. The array of claim 27, wherein the floating gate electrodes have a first major surface adjacent the first insulating layer having a channel surface area over the channel region, and a second major surface adjacent the second insulating layer having a control surface area under the control electrode substantially equal to the channel surface area.

30. A flash EPROM transistor array, comprising:
a semiconductor substrate of a first conductivity type;
a plurality of spaced apart, relatively thick insulating regions in the substrate elongated in a first direction to provide a plurality of isolated regions in the substrate;
a plurality of first drain diffusion regions in respective isolated regions and elongated in the first direction, each aligned on one side with, and against, a respective one of the plurality of insulating regions;
a plurality of source diffusion regions in respective isolated regions, elongated in the first direction, and each spaced away from the first drain diffusion regions to provide a first channel region between the source and first drain diffusion regions in the respective isolated regions;
a plurality of second drain diffusion regions in respective isolated regions and elongated in the first direction each aligned on one side with a respective one of the plurality of insulating regions, and spaced away from the source diffusion region to provide a second channel region between the source and second drain diffusion regions in the respective isolated regions;
a first insulating layer over the substrate, over the first and second channel regions, over the source diffusion region, and over the first and second drain diffusion regions in the respective isolated regions;
a first plurality of floating gate electrodes over the first insulating layer over the first 8 channel regions in the plurality of isolation regions;
a second plurality of floating gate electrodes over the first insulating layer over the second channel regions in the plurality of isolation regions;
a second insulating layer over the first and second pluralities of floating gate electrodes; and
a plurality of wordline conductors over the second insulating layer elongated in a second direction, each lying across the plurality of thick insulating regions, over the source diffusion regions, and the first and second drain diffusion regions, and overlying a floating gate electrode in the first plurality and a floating gate electrode in the second plurality, to form a plurality of pairs of flash EPROM transistors in the respective isolated regions having shared source diffusion regions.

31. The array of claim 30, further including:
a plurality of first bitline conductor and a second bitline conductor pairs associated with respective isolated regions;
a plurality of first block select transistors, each having a first channel terminal coupled to the first drain diffusion region in a respective isolated region, having a second channel terminal coupled to the first bitline conductor in the pair associated with the respective isolated region, and having a gate electrode coupled to a block select signal;
a plurality of second block select transistors, each having a first channel terminal coupled to the second drain diffusion region in a respective isolated region, having a second channel terminal coupled to the second bitline conductor in the pair associated with the respective isolated region, and having a gate electrode coupled to the block select signal;
means, coupled to the plurality of source diffusion regions, for supplying a source potential to the plurality of source diffusion regions; and
column select means, coupled to the plurality of first and second bitline conductor pairs, for selectively enabling the bitline conductors.

32. The array of claim 31, wherein the plurality of first and second bitline conductor pairs are elongated in the first direction and insulated from the plurality of wordline conductors.

33. The array of claim 32, wherein the first and second bitline conductor pairs overlie respective isolated regions between the thick insulating regions.

34. The array of claim 31, further including:
means, coupled with the plurality of bitline conductors, wordline conductors, and the means for supplying a source potential, for controlling voltage potentials of the bitline conductors, wordline conductors and source diffusion regions, and for supplying the block select signal to provide program, erase and read modes.

35. The array of claim 31, further including:
a source potential conductor; and
wherein the means for supplying a source potential comprises a source block select transistor having a first channel terminal coupled to the plurality of source diffusion regions, having a second channel terminal coupled to the source potential conductor, and having a gate electrode coupled to receive the block select signal.

36. The array of claim 35, wherein the source potential conductor is essentially parallel to the plurality of bitline conductors.

37. The array of claim 30, wherein the pluralities of first and second drain diffusion regions consist of contactless diffusion regions.

38. The array of claim 30, wherein the plurality of source diffusion regions have distributions of dopants providing gradual channel junctions.

39. The array of claim 38, wherein the distributions of dopants in the plurality of source diffusion regions include a shallower region doped with arsenic and phosphorous, and a deeper region doped with phosphorous to form the gradual channel junctions.

40. The array of claim 30, wherein a given flash EPROM transistor in the plurality of flash EPROM transistors in the array has a capacitive coupling ratio, and the floating gate electrode of the given flash EPROM transistor extends under the control gate electrode over the channel region, and over the drain diffusion regions of the given flash EPROM transistor, and further extends over a portion of one of the first and second the relatively thick insulation regions, so that the capacitive coupling ratio is increased.

41. The array of claim 30, wherein a given flash EPROM transistor in the plurality of flash EPROM transistors in the array has a capacitive coupling ratio, and the first insulating layer has a first thickness over the channel region of the given flash EPROM transistor for F-N tunneling, and the second insulating layer has a second thickness over the floating gate electrode of the given flash EPROM transistor so that the coupling ratio is greater than about 40%.

42. The array of claim 41, wherein the first thickness is less than about 120 angstroms and the second thickness is within a range of plus or minus about 20% of the first thickness.

43. The array of claim 41, wherein the floating gate electrodes have a first major surface adjacent the first insulating layer having a channel surface area over the channel region, and a second major surface adjacent the second insulating layer having a control surface area under the control electrode substantially equal to the channel surface area.

44. The flash EPROM transistor array of claim 1, further including:
   a reference conductor; and
   a transistor having a first terminal contacting the reference conductor and having a second terminal coupled to the contactless source diffusion region, and a control terminal connected to a reference control signal, by which the transistor connects or disconnects the contactless source diffusion region to or from the reference conductor.

45. A flash EPROM transistor array, comprising:
   a semiconductor substrate of a first conductivity type;
   a contactless drain diffusion region of a second conductivity type in the substrate and elongated in a first direction;
   a contactless source diffusion region of the second conductivity type in the substrate, elongated in the first direction, and spaced away from the drain diffusion region to provide channel region between the source and drain diffusion regions;
   a first insulating layer over the substrate, over the channel region, and over the source and drain diffusion regions;
   a plurality of floating gate electrodes overlying the first insulating layer over the channel region;
   a second insulating layer over the plurality of floating gate electrodes;
   a plurality of control gate electrodes over the second insulating layer elongated in a second direction intersecting the source and drain diffusion regions over respective floating gate electrodes, to form a plurality of flash EPROM transistors across the channel region;
   a data conductor; and
   means, having a contact to the data conductor and having a diffusion region coupled to the contactless drain diffusion region, for gating current between the data conductor and the contactless drain diffusion region.

46. The flash EPROM transistor mean of claim 45 further including:
   a reference conductor; and
   means, having a contact to the reference conductor and having a diffusion region coupled to the contactless source diffusion region, for gating current between the reference conductor and the contactless source diffusion region.

47. A floating gate transistor array, comprising a semiconductor substrate of a first conductivity type;
   a drain diffusion region of a second conductivity type in the substrate and elongated in a first direction and having a drain width transverse to the first direction;
   a source diffusion region of the second conductivity type in the substrate, elongated in the first direction, and spaced away from the drain diffusion region to provide channel region between the source and drain diffusion regions;
   a first insulating layer over the substrate, over the channel region, and over the source and drain diffusion regions;
   a plurality of floating gate electrodes overlying the first insulating layer over the channel region;
   a second insulating layer over the plurality of floating gate electrodes;
   a plurality of control gate electrodes over the second insulating layer elongated in a second direction intersecting the source and drain diffusion regions over respective floating gate electrodes, to form a column of floating gate transistors across the channel region;
   a bitline;
   a bitline switch having a first terminal coupled to the drain diffusion region, a second terminal contacting the bitline, and a control terminal connected to a bitline connect signal line, in response to which the switch connects or disconnects the bitline to or from the drain diffusion region;
   a reference line; and
   a reference line switch having a first terminal coupled to the source diffusion region, a second terminal contacting the reference line, and a control terminal connected to a reference line connect signal line, in response to which the switch connects or disconnects the reference line to or from the contactless source diffusion region.

48. The floating gate transistor array of claim 47, wherein the reference line comprises a conductor elongated in a second direction orthogonal to the first direction.

49. The floating gate transistor array of claim 48, wherein the conductor comprises a buried diffusion region, and the reference line switch comprises a transistor having a drain in the source diffusion region, a source in the buried diffusion region, and a gate connected to the reference line connect signal line.

50. The floating gate transistor array of claim 10, wherein the means for supplying a source potential comprises:
   a reference line; and
   a reference line switch having a first terminal coupled to the source diffusion region, a second terminal contacting the reference line, and a control terminal connected to a reference line connect signal line, in response to which the switch connects or disconnects the reference line to or from the source diffusion region.

51. The floating gate transistor array of claim 50, wherein the reference line comprises a conductor elongated in a second direction orthogonal to the first direction.

52. The floating gate transistor array of claim 51, wherein the conductor comprises a buried diffusion region, and the reference line switch comprises a transistor having a drain in the source diffusion region, a source in the buried diffusion region, and a gate connected to the reference line connect signal line.

53. A floating gate transistor array, comprising:
   a semiconductor of a first conductivity type;
   a plurality of first drain diffusion regions in the semiconductor elongated in a first direction;

a plurality of source diffusion regions in the semiconductor elongated in the first direction, and each spaced away from a corresponding one of the plurality of first drain diffusion regions to provide a first channel region between the source and first drain diffusion regions;

a plurality of second drain diffusion regions in the semiconductor elongated in the first direction and spaced away from a corresponding one of the plurality of source diffusion regions to provide a second channel region between the source and second drain diffusion regions;

a first insulating layer over the semiconductor, over the first and second channel regions, over the source diffusion region, and over the first and second drain diffusion regions in the respective isolated regions;

a first plurality of floating gate electrodes over the first insulating layer over the first channel regions;

a second plurality of floating gate electrodes over the first insulating layer over the second channel regions;

a second insulating layer over the first and second pluralities of floating gate electrodes;

a plurality of wordline conductors over the second insulating layer elongated in a second direction, each lying over the source diffusion regions, and the first and second drain diffusion regions, and a floating gate electrode in the first plurality and a floating gate electrode in the second plurality, to form a plurality of pairs of floating gate transistors having shared source diffusion regions;

a plurality of bitlines elongated in the first direction;

a plurality of bitline switches, coupled to the plurality of first drain diffusion regions and the plurality of second drain diffusion regions, and to the plurality of bitlines, which connect or disconnect bitlines to or from selected first and second drain diffusion regions;

a reference line elongated in the second direction; and a reference line switch coupled to the plurality of source diffusion regions and to the reference line, which connects or disconnects the reference line to or from selected source diffusion regions.

54. The floating gate transistor array of claim 53, wherein the reference line comprises a buried diffusion region, and the reference line switch comprises a transistor having a drain terminal coupled to the plurality of source diffusion regions, a source in the buried diffusion region, and a gate connected to a reference line connect signal line.

* * * * *